(12) United States Patent
McBride

(10) Patent No.: US 6,367,062 B1
(45) Date of Patent: *Apr. 2, 2002

(54) SYSTEM AND METHOD FOR DETECTING AN EXCESSIVE NUMBER OF SERIES-CONNECTED PASS FETS

(75) Inventor: John G. McBride, Ft Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/252,138

(22) Filed: Feb. 18, 1999

(51) Int. Cl.[7] ............................................. G06F 17/50
(52) U.S. Cl. .............................. 716/12; 716/6; 716/10; 326/38; 326/49
(58) Field of Search ............................. 438/10; 703/18, 703/19; 326/38, 49; 714/726; 716/6, 12, 10

(56) References Cited

U.S. PATENT DOCUMENTS

| | | | |
|---|---|---|---|
| 4,566,064 A | 1/1986 | Whitaker | 326/38 |
| 5,446,676 A * | 8/1995 | Huang et al. | 703/19 |
| 5,696,771 A | 12/1997 | Beausang et al. | 714/726 |
| 5,880,967 A | 3/1999 | Jyu et al. | 716/6 |
| 5,889,685 A | 3/1999 | Ramachandran | 703/18 |
| 5,966,521 A | 10/1999 | Takeuchi et al. | 716/6 |
| 6,077,717 A | 6/2000 | McBride | 438/10 |
| 6,209,122 B1 * | 3/2001 | Jyu et al. | 716/6 |

OTHER PUBLICATIONS

Tehrani, P., et al.; "Deep Sub–Micron Static Timing Analysis in Presence of Crosstalk"; IEEE International Symposium on Quality Electronic Design, 2000; pp. 505–512.
Microsoft Press Computer Dictionary, 3rd. ed.

* cited by examiner

Primary Examiner—Matthew Smith
Assistant Examiner—Jibreel Speight

(57) ABSTRACT

In accordance with one aspect of the invention, a method is provided for identifying multiple, series-connected pass FETs in an integrated circuit, by evaluating a current node in the netlist to determine whether the current node is a static gate input (or output). If the node is that of a pass gate input (or output), the method then identifies at least one pass FET that is channel-connected to the current node, and determines that an output node (input node) of the at least one pass FET is the same node as the current node. Thereafter, the method reassigns the current node to be an input node (output node) of the at least one pass FET, and repeats the foregoing steps (beginning with identifying at least one pass FET that is channel-connected to the current node). In accordance with another aspect of the present invention, a system is provided for identifying multiple, series-connected pass FETs in an integrated circuit by evaluating a netlist. Preferably, the system is implemented in software and includes various code segments for: identifying a current node that is at an endpoint of a series of pass FET devices, identifying at least one pass FET that is series connected to the current node, evaluating direction of the at least one pass FET device, and resetting a new "current node" to a channel node of the at least one pass FET that is opposite the previous "current node".

20 Claims, 12 Drawing Sheets

ELEMENT { ~~~~
~~~~

Complementary Pass FET
RAM Pass FET
Single Pass FET

~~~~~~
~~~~~~

Direction: Unset, Bidirectional, Source-to-Drain,
    Drain-to-Source

~~~~~}

SYSTEM AND METHOD FOR DETECTING AN EXCESSIVE NUMBER OF SERIES-CONNECTED PASS FETS

BACKGROUND OF THE INVENTION

1. Field of the Invention

The present invention generally relates to computer-aided circuit design systems, and more particularly to a system and method for evaluating a netlist of an integrated circuit to identify pass FETs and determine if an excessive number are connected in series.

2. Discussion of the Related Art

Integrated circuits are electrical circuits comprised of transistors, resistors, capacitors, and other components on a single semiconductor "chip" in which the components are interconnected to perform a given function such as a microprocessor, programmable logic device (PLD), electrically erasable programmable memory (EEPROM), random access memory (RAM), operational amplifier, or voltage regulator. A circuit designer typically designs the integrated circuit by creating a circuit schematic indicating the electrical components and their interconnections. Often, designs are simulated by computer to verify functionality and ensure performance goals are satisfied.

In the world of electrical device engineering, the design and analysis work involved in producing electronic devices is often performed using electronic computer aided design (E-CAD) tools. As will be appreciated, electronic devices include electrical analog, digital, mixed hardware, optical, electro-mechanical, and a variety of other electrical devices. The design and the subsequent simulation of any circuit board, VLSI chip, or other electrical device via E-CAD tools allows a product to be thoroughly tested and often eliminates the need for building a prototype. Thus, today's sophisticated E-CAD tools may enable the circuit manufacturer to go directly to the manufacturing stage without costly, time consuming prototyping.

In order to perform the simulation and analysis of a hardware device, E-CAD tools must deal with an electronic representation of the hardware device. A "netlist" is one common representation of a hardware device. As will be appreciated by those skilled in the art of hardware device design, a "netlist" is a detailed circuit specification used by logic synthesizers, circuit simulators and other circuit design optimization tools. A netlist typically comprises a list of circuit components and the interconnections between those components.

The two forms of a netlist are the flat netlist and the hierarchical netlist. Often a netlist will contain a number of circuit "modules" which are used repetitively throughout the larger circuit. A flat netlist will contain multiple copies of the circuit modules essentially containing no boundary differentiation between the circuit modules and other components in the device. By way of analogy, one graphical representation of a flat netlist is simply the complete schematic of the circuit device.

In contrast, a hierarchical netlist will only maintain one copy of a circuit module which may be used in multiple locations. By way of analogy, one graphical representation of a hierarchical netlist would show the basic and/or non-repetitive devices in schematic form and the more complex and/or repetitive circuit modules would be represented by "black boxes." As will be appreciated by those skilled in the art, a black box is a system or component whose inputs, outputs, and general function are known, but whose contents are not shown. These "black box" representations, hereinafter called "modules", will mask the complexities therein, typically showing only input/output ports.

An integrated circuit design can be represented at different levels of abstraction, such as the Register-Transfer level (RTL) and the logic level, using a hardware description language (HDL). VHDL and Verilog are examples of HDL languages. At any abstraction level, an integrated circuit design is specified using behavioral or structural descriptions or a mix of both. At the logical level, the behavioral description is specified using Boolean equations. The structural description is represented as a netlist of primitive cells. Examples of primitive cells are full-adders, NAND gates, latches, and D-Flip Flops.

Having set forth some very basic information regarding the representation of integrated circuits and other circuit schematics through netlists, systems are presently known that use the information provided in netlists to evaluate circuit timing and other related parameters. More specifically, systems are known that perform a timing analysis of circuits using netlist files. Although the operational specifics may vary from system to system, generally such systems operate by identifying certain critical timing paths, then evaluating the circuit to determine whether timing violations may occur through the critical paths. As is known, timing specifications may be provided to such systems by way of a configuration file.

One such system known in the prior art is marketed under the name PathMill, by EPIC Design Technology, Inc. (purchased by Synopsys). PathMill is a transistor-based analysis tool used to find critical paths and verify timing in semiconductor designs. Using static and mixed-level timing analysis, PathMill processes transistors, gates, and timing models. It also calculates timing delays, performs path searches, and checks timing requirements. As is known, PathMill can analyze combinational designs containing gates, and sequential designs containing gates, latches, flip-flops, and clocks. Combinational designs are generally measured through the longest and shortest paths.

While tools such as these are useful for the design verification process after layout, there are various shortcomings in the PathMill product and other similar products. For example, there is often a need to identify certain logic gates or particular combinations of logic gates. More specifically, there is sometimes a need or desire to identify combinations of gates that are configured in such a manner that may lead to operational uncertainty or performance problems. By way of particular example, it is sometimes desirable to identify multiple, series-connected pass FETs. As is known by persons skilled in the art, the presence of multiple, series connected pass FETs in a circuit design often degrades performance of an integrated circuit by slowing the output response, or otherwise due to parasitic capacitances that are associated with the components.

Accordingly, there is a heretofore unaddressed need to provide a design tool that evaluates a netlist or other electronic file representative of an electronic circuit to identify circuit configurations that form series connected pass FETs.

SUMMARY OF THE INVENTION

Certain objects, advantages and novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

To achieve the advantages and novel features, the present invention is generally directed to a system and method for identifying multiple, series-connected pass FETs in an integrated circuit by evaluating a netlist of the integrated circuit. In accordance with one aspect of the invention, a method is implemented to evaluate a current node in the netlist to determine whether the current node is a pass gate output. If the current node is that of a static gate input, the method then identifies at least one pass FET that is channel-connected to the current node, and determines that an output node of the at least one pass FET is the same node as the current node. Thereafter, the method reassigns the current node as an input node of the at least one pass FET, and repeats the foregoing steps (beginning with identifying at least one pass FET that is channel-connected to the current node).

In accordance with a similar aspect of the invention, a method is implemented by evaluating a current node in the netlist to determine whether the current node is a pass gate input. If the node is that of a pass gate input, the method then identifies at least one pass FET that is channel-connected to the current node, and determines that an output node of the at least one pass FET is the same node as the current node. Thereafter, the method reassigns the current node as an output node of the at least one pass FET, and repeats the foregoing steps (beginning with identifying at least one pass FET that is channel-connected to the current node).

In accordance with the preferred embodiment, the methods summarized above are implemented in a software routines that are called recursively. In addition, the the step of identifying at least one pass FET preferably includes the step of evaluating a data structure for each element connected to the current node. In this regard, the step of evaluating the data structure includes examining flags within the data structure. Preferably, the flags include flags for identifying the pass FET as a single pass FET, a complementary pass FET, or a RAM pass FET. Similarly, the step of determining that an output node of the at least one pass FET further includes the step of evaluating a direction flag within a data structure of the at least one pass FET. Preferably, the direction flag may be set as either "unset", "bidirectional", "source-to-drain", or "drain-to-source".

In accordance with yet another aspect of the present invention, a system is provided for identifying multiple, series-connected pass FETs in an integrated circuit by evaluating a netlist. The system includes means for identifying a current node that is at an endpoint of a series of pass FET devices, means for identifying at least one pass FET that is series connected to the current node, means for evaluating direction of the at least one pass FET device, and means for resetting a new "current node" to a channel node of the at least one pass FET that is opposite the previous "current node". Preferably, the system is realized in part through a software package and each of the foregoing means is implemented through one or more software routines.

DESCRIPTION OF THE DRAWINGS

The accompanying drawings incorporated in and forming a part of the specification, illustrate several aspects of the present invention, and together with the description serve to explain the principles of the invention. In the drawings.

DETAILED DESCRIPTION OF THE PREFERRED EMBODIMENT

Figure 1:
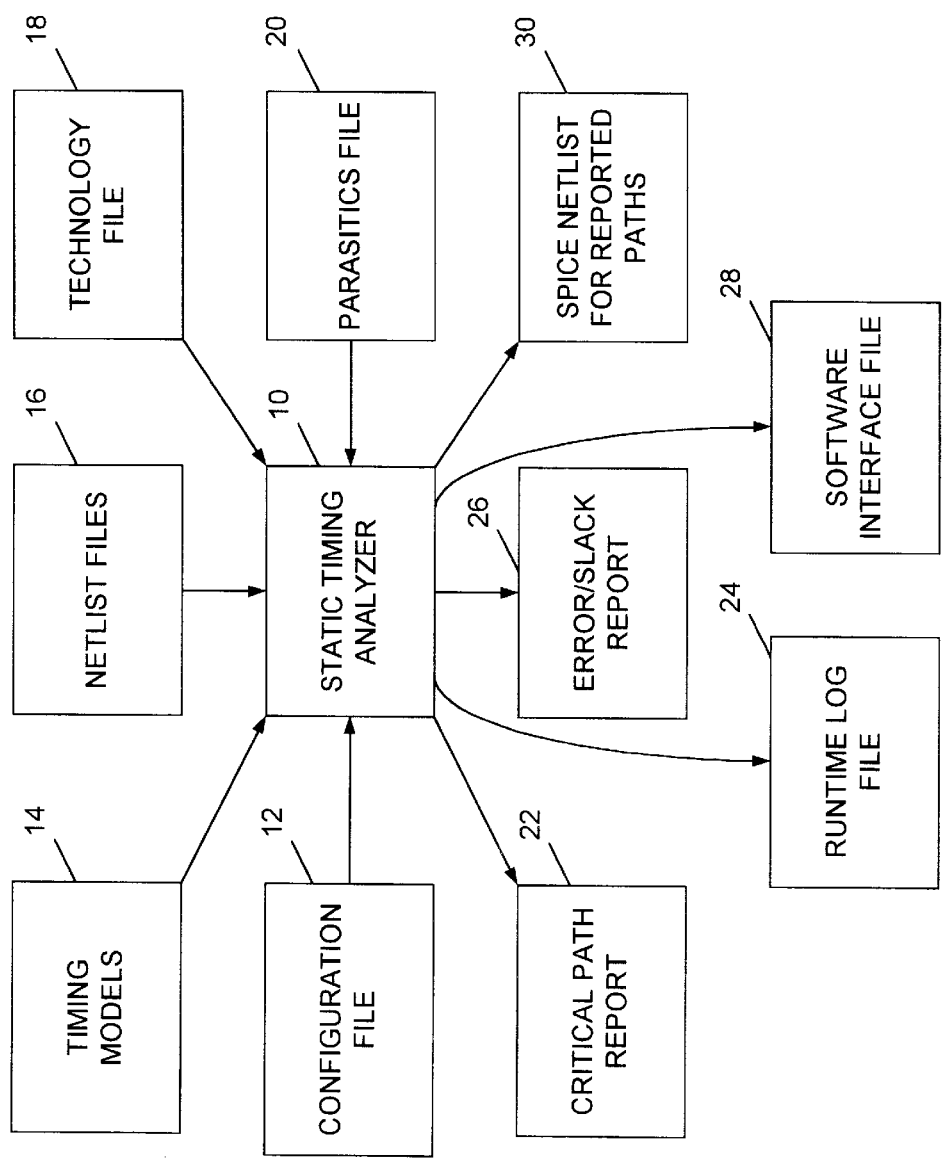
FIG. 1 is a block diagram of a static timing analyzer system, as is known in the prior art.

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

Referring now to the drawings, reference is made to FIG. 1, which is a block diagram of a prior art static timing analyzer program that illustrates the basic informational flow in such a system. Specifically, and as previously mentioned, one such system is marketed under the name PathMill. FIG. 1 is a diagram that illustrates the informational flow in the PathMill system. At the center of the diagram is a block denoted as Static Timing Analyzer 10, which represents the PathMill program. Surrounding this block 10 are a number of other blocks that represent various input and output files and/or information.

More particularly, the PathMill program may utilize a configuration file 12, a file of timing models 14, one or more netlist files 16, a technology file 18, and a parasitics file 20, for various input information. In addition, the PathMill program may generate a number of different output files or other output information, including a critical path report 22, a runtime log file 24, an error report 26, a software interface file 28, and a SPICE netlist 30. When started, the PathMill program first processes the input netlist file(s) 16, the technology file 18, and the configuration files 12. The information from these files is subsequently used for performing path analyses. Since the PathMill program is publicly available and marketed, its function and operation are well known, and therefore need not be discussed in detail herein.

For purposes of illustrating the present invention, much of the diagram and information illustrated in FIG. 1 is not shown in connection with the inventive system. In this regard, reference is made to FIG. 2, which shows one embodiment of a system constructed in accordance with the present invention. In the illustrated embodiment, only the static timing analyzer 10, the configuration file 12 and the netlist file 16 of FIG. 1 are shown. The configuration file(s) 12 contains information that informs the static timing analyzer 10 how to perform its analysis, and various numbers of configuration files may be used. The netlist file 16, as is known, defines the various integrated circuit components, and their inter-relations. The static timing analyzer 10 may make its internal database or netlist available to the electrical rules checker and may generate a binary file output 106

The electrical rules checker 100 program of the present invention is preferably configured to operate on an output of the static timing analyzer 10. In this regard, the static timing analyzer may be configured to generate an output netlist database, which the electrical rules checker of the present invention utilizes as an input. As previously mentioned, there are a wide variety of reasons why an electrical rules checking program may be desired. One such reason is to perform various checks over certain rules or strategies in an integrated circuit design. Such rules may vary from circuit to circuit, depending upon the particular application. A portion 102 of the electrical rules checker program 100 of the preferred embodiment of the present invention operates to identify multiple, series-connected pass FETs.

As is known, a large scale integrated circuit design is often done at the FET level. A designer may utilize thousands of interconnected FETs in designing a portion of an integrated circuit. Although the designer may make every effort to follow certain design guidelines, mistakes may nevertheless be made. Accordingly, the electrical rules checker of the present invention provides an excellent mechanism for double-checking designs and design layouts.

Figure 2:
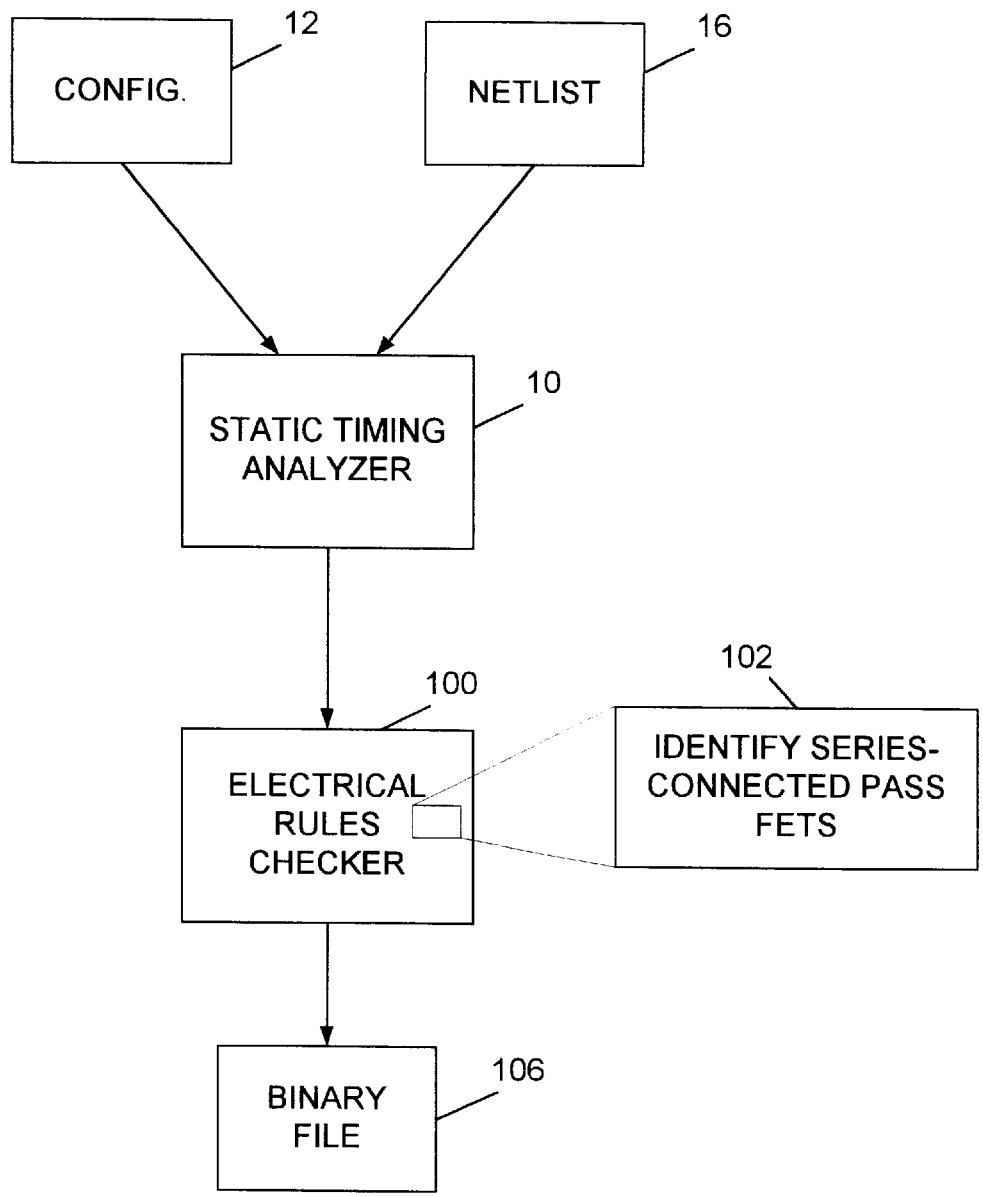
FIG. 2 is a block diagram illustrating the orientation of the electrical rules checking method of the present invention, in relation to an existing static timing analyzer.

In keeping with the description of FIG. 2, the electrical rules checker 100 of the present invention may generate an output binary file 106, which may ultimately be used in subsequent executions of the electrical rules checker program 100.

Having described certain fundamental environmental and background system information, the discussion will now provide additional environmental information directed toward the preferred embodiment of the present invention. In this regard, a fundamental aspect of the present invention is to provide a method for detecting multiple, series-connected pass FET devices from a netlist. A first step toward this ultimate goal, however, is to identify individual pass FET devices. In accordance with the preferred embodiment of the invention, three different types of pass FETs may be identified. These include complementary pass FETs, RAM pass FETs, and single pass FETs. Preferably, a data structure is associated with each element of a netlist (See FIG. 3). Among a large number of parameters or characteristics, the element data structure of the preferred embodiment includes three separate flags that may be used in identifying the given element as a pass FET device. Specifically, a "Complementary Pass FET" flag may be set if the element is determined to be a complementary pass FET, a "RAM Pass FET" flag may be set if the element is determined to be a RAM pass FET, and a "Single Pass FET" flag may be set if the element is determined to be a single pass FET.

As will be further described below, the method of the preferred embodiment of the present invention first evaluates a netlist to identify individual pass FET devices of each of these types, and sets the appropriate flags of the data structure for each element. Then, the method of the invention identifies multiple, series-connected pass FETs, by evaluating these flags. Before describing the method of the present invention, however, the discussion will first more fully describe the manner in which the preferred embodiment detects the different types of single pass FET devices.

Figures 3, 4:
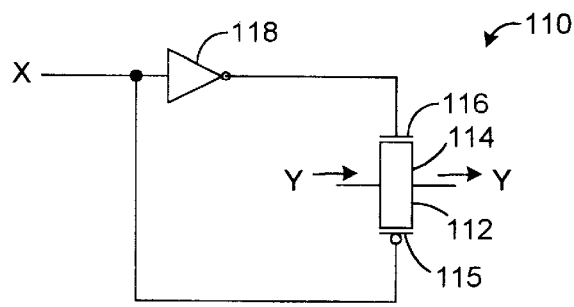
FIG. 3 is a diagram illustrating a portion of a data structure of a circuit element, depicting certain flags, in accordance with the invention.
FIG. 4 is a schematic diagram illustrating a complimentary pass FET configuration.

Before describing this, however, reference will first be made to FIGS. 4, 5, 6A and 6B, which are schematic diagrams that illustrate the electrical connectivity of a complimentary pass FET, a RAM pass FET, and single pass FETs, respectively. Referring first to FIG. 4, a complimentary pass FET 110 circuit configuration is shown. In short, a complimentary pass FET is defined by a channel-parallel connection between a PFET 112 and an NFET 114, where the gate node 115 of the PFET is driven by the inverse signal of the gate node 116 of the NFET. In this regard, the complimentary pass FET 110 illustrated in FIG. 4 shows a PFET device 112 having its channel nodes (e.g., source node and drain node) directly connected to the channel nodes of the NFET device 114. An input signal X directly drives the gate node 115 of the PFET. That same signal X drives the input of an inverter 118, whose output directly drives the gate node 116 of the NFET 114. It will be appreciated by those skilled in the art that this particular circuit configuration comprises a complimentary pass FET, wherein a signal Y applied to the source nodes of the PFET 112 and NFET 114 is passed through to the drain nodes of the same devices.

Figure 5:
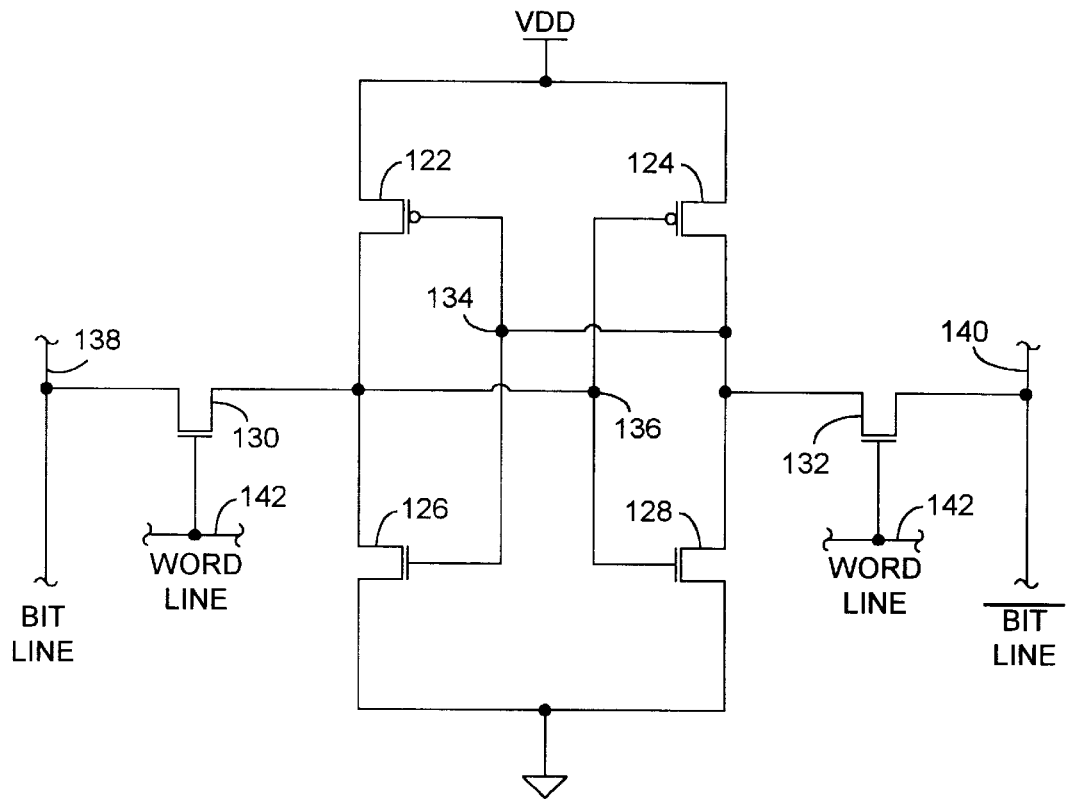
FIG. 5 is a schematic diagram illustrating a RAM pass FET configuration.

Referring to FIG. 5, a schematic diagram of a RAM pass FET 132 (i.e., a pass FET connected to a RAM cell) is shown. As is known by persons skilled in the art, a RAM cell is comprised of cross-coupled inverters. As is further known, an inverter is constructed from a pair of FETs, specifically comprising a PFET series connected (channel nodes) with an NFET, wherein the series connected devices are connected between VDD and ground. The input to such an inverter is applied to the gate node of both FET devices, and the output is taken from the common channel node between the two FET devices.

More specifically, and as illustrated in FIG. 5, a RAM cell comprising PFETs 122 and 124, and NFETs 126, 128, 130, and 132 is shown. The illustrated interconnections between PFET 122 and NFET 126, between VDD and ground comprises a first inverter having an input on node 134 and an output on node 136. Likewise, the illustrated interconnections between PFET 124 and NFET 128, between VDD and ground comprises a second inverter having an input at node 136 and an output at node 134. The two inverters are said to be cross-coupled since the input of each is connected to the output of the other. Completing the RAM cell are NFETs 130 and 132. In a manner that is well known, NFET 130 is channel connected between node 136 and a bit line 138 for the RAM device. Similarly, NFET 132 is channel connected between node 134 and the inverse of bit line 138, which inverse bit line is designated by reference numeral 140. Both NFETs 130 and 132 are gate connected to a common word line 142 of the RAM device. Operation of the above-described RAM cell need not be described herein, as it will be appreciated by those of ordinary skill in the art. Indeed, the drawing of FIG. 5 is presented herein simply to assist in illustrating the method of the preferred embodiment of the present invention.

Figure 6A:
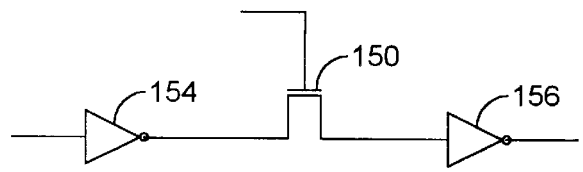
FIGS. 6A and 6B are schematic diagrams illustrating single pass FET configurations for and NFET and PFET, respectively.
Figure 6B:
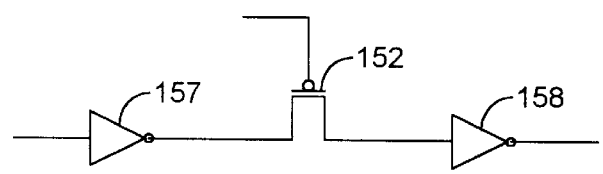

Referring briefly to FIGS. 6A and 6B, single pass FET structures are shown. In this regard, FIG. 6A illustrates an NFET 150 configured as a pass FET, while FIG. 6B illustrates a PFET 152, configured as a pass FET. As previously mentioned, a pass FET is broadly defined as comprising a gate that interconnects an output of one gate to an input of another gate. Accordingly, the NFET 150 of FIG. 6A is illustrated as interconnecting the output of an inverter 154 to the input of a second inverter 156. Likewise, the PFET 152 of FIG. 6B is illustrated as interconnecting the output of an inverter 157 to the input of a second inverter 158. In accordance with one aspect of the invention, the present invention will identify either configuration shown above as identifying element as a single pass FET device.

Figure 7A:
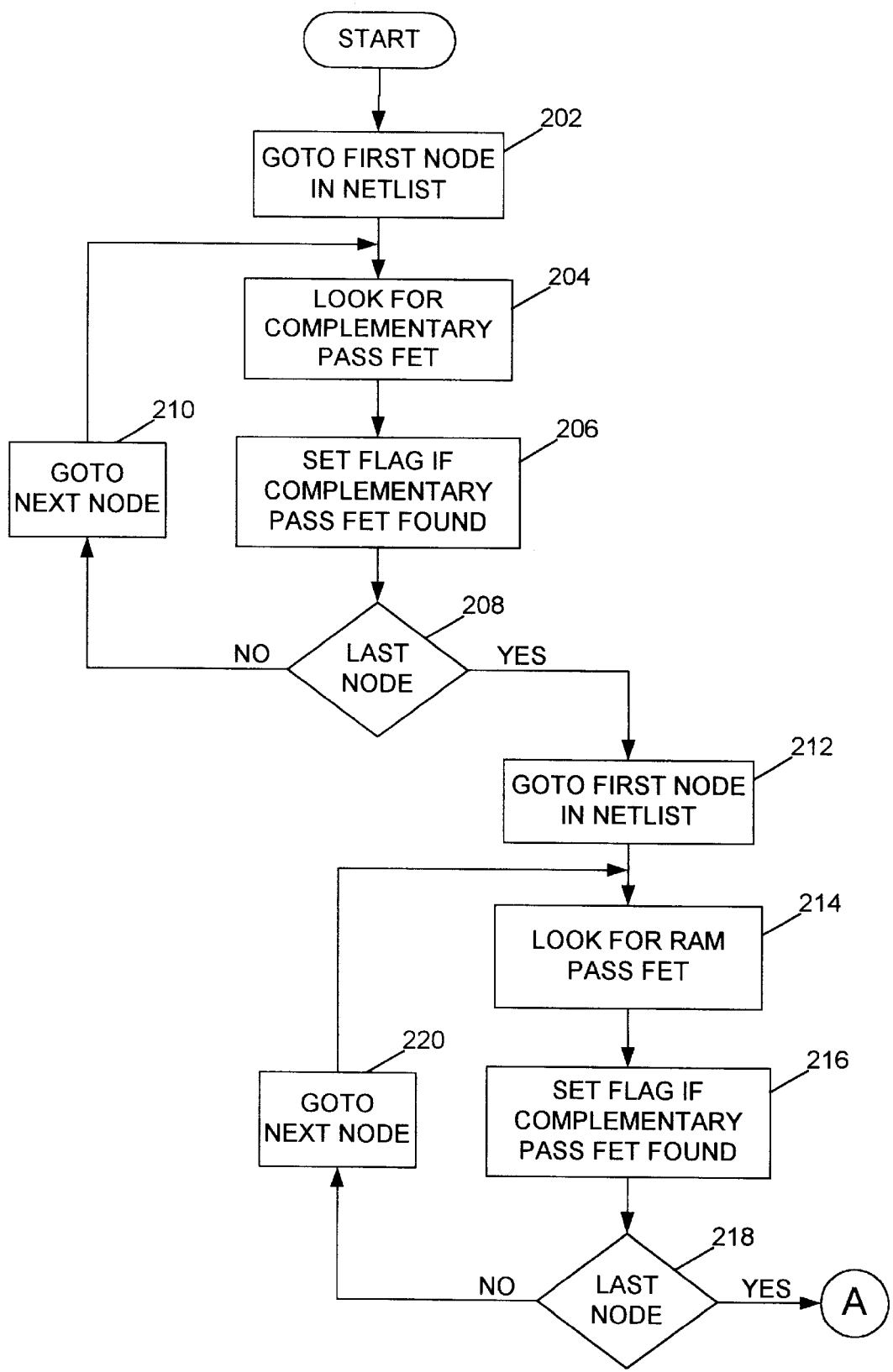
FIGS. 7A–7B collectively are a flow chart illustrating the top-level functional operation of a method for identifying individual pass FETs from a netlist.
Figure 7B:
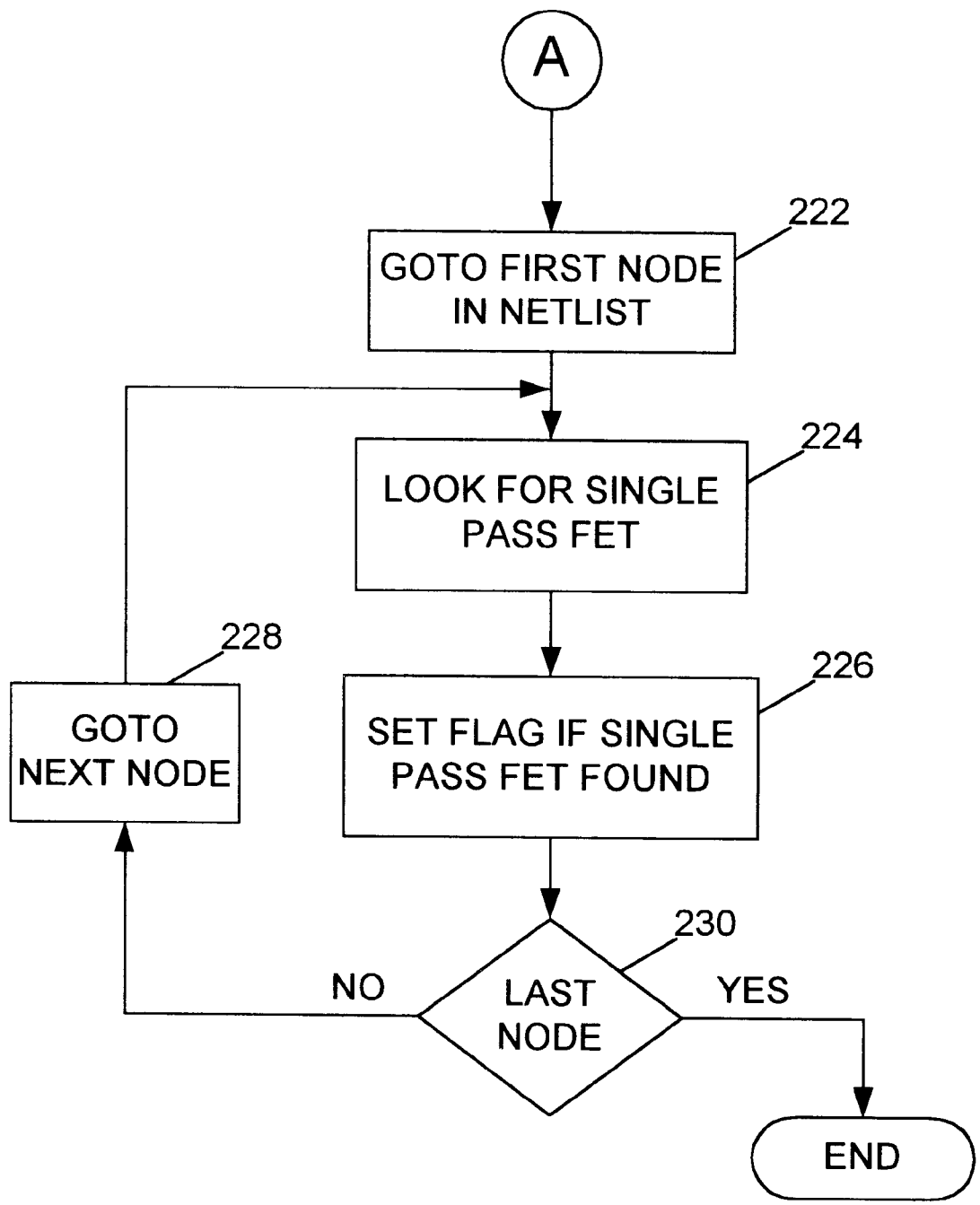

Having set forth the basic circuit configurations of the various pass FET structures identified by the method of the present invention, reference is now made to FIGS. 7A and 7B, which collectively comprise a flow chart that illustrates the top-level functional operation of a method for identifying single pass FET devices, constructed in accordance with the preferred embodiment of the present invention. In short, the method of this portion of the preferred embodiment makes three sequential passes through each node of the netlist. In a first pass, the method identifies all complimentary pass FET configurations, and for any such identified configuration, will set the appropriate flag in the data structure for each element, accordingly. On a second pass through the netlist, the method identifies all RAM pass FETs, and sets the appropriate element flags. Finally, in a third pass through the netlist, the method of the preferred embodiment identifies all single pass FET configurations, and sets the appropriate element flags. In this regard, the method begins by going to a first node in the netlist (step 202). At that node, the method then looks for all interconnected elements to identify a complimentary pass FET configuration (step 204). Additional detail regarding this step of the method will be further described in connection with FIGS. 8A and 8B. For all elements identified as comprising complimentary pass FET configurations, the method sets the appropriate flag of the element data structure accordingly (step 206). The method then evaluates (step 208) whether the previously evaluated netlist node was the last node of the netlist. If not, the method proceeds to the next node in the netlist (step 210) and returns to step 204. This loop is repeated until the entire netlist file has been traversed.

If step 208 resolves to true, then the netlist has been entirely traversed once, and the method returns to the first node in the netlist (step 212). It then evaluates this node for all channel connected elements to determine whether any such elements comprise a RAM-type pass FET (step 214). Further detail regarding this step will be illustrated in connection with the flow chart of FIG. 9. For every pass FET identified in step 214 as a RAM pass FET, the method then sets the appropriate flag of the element data structures accordingly (step 216). The method then determines whether the previously evaluated node was the last node of the netlist (step 218). If not, the method proceeds to the next node (step 220) and returns to step 214. This processing loop is repeated until all nodes of the netlist have been evaluated.

Accordingly, if step 218 resolves to yes, the method then returns to the first node of the netlist (step 222). It then evaluates the current node for FET devices that constitute a single pass FET device (step 224). In this regarding, the method determines whether the node under present evaluation is an output node. If so, then the method looks to identify all FET devices that are channel connected to this node. For all such FET devices identified, the method looks to the channel node opposite the current node to determine whether that channel node is an input node (e.g., a node connected to the input of another gate). If so, all such identified FETs may be considered pass FETs.

As will be appreciated by those skilled in the art, a node may be determined to be an output node by evaluating the direction flags of the various elements that are channel-connected to that node, or by evaluating certain flags associated with the node. Such flags may be set by PathMill, by the system of the preferred embodiment, or in some other fashion, consistent with the concepts and teachings of the present invention. Since the manner in which a node may be determined to be an output node may vary, a detailed discussion of this aspect of the system and method of the preferred embodiment need not be provided herein. For each FET so identified, the present invention will reset the "current node" to the node opposite the original current node, and repeat the above-described evaluation. In this way, the invention will traverse a string of series-connected pass FETs, setting the single pass FET flag within the element data structure of each pass FET within the string. The invention will continue to traverse the string, until reaching a static gate input or a supply. Thus, the string of pass FETs will be defined as those pass FETs extending between a static gate input and a static gate output, or between a static gate output and a supply.

In addition, the method may further confirm that any such identified FET device has not already been identified as comprising a portion of a complimentary pass FET or a RAM pass FET (by evaluating the appropriate flags of that element's data structure). If the current element has not been previously designated as either a complimentary pass FET or a RAM pass FET, then it is determined to be a single pass FET, and the single pass FET flag of that element's data structure may be set (step 226). The method then evaluates whether the previously evaluated node is the last node of the netlist (step 230). If not, the method proceeds to the next node (step 228) and returns to step 224. This processing loop is repeated until all nodes of the netlist have been evaluated. Thus, if step 230 resolves to yes, the method of the present invention is complete. It will be appreciated that at this point, all pass FET elements within the netlist will have been identified and designated as either complimentary pass FETs, RAM pass FETs, or single pass FETs.

Figure 8A:
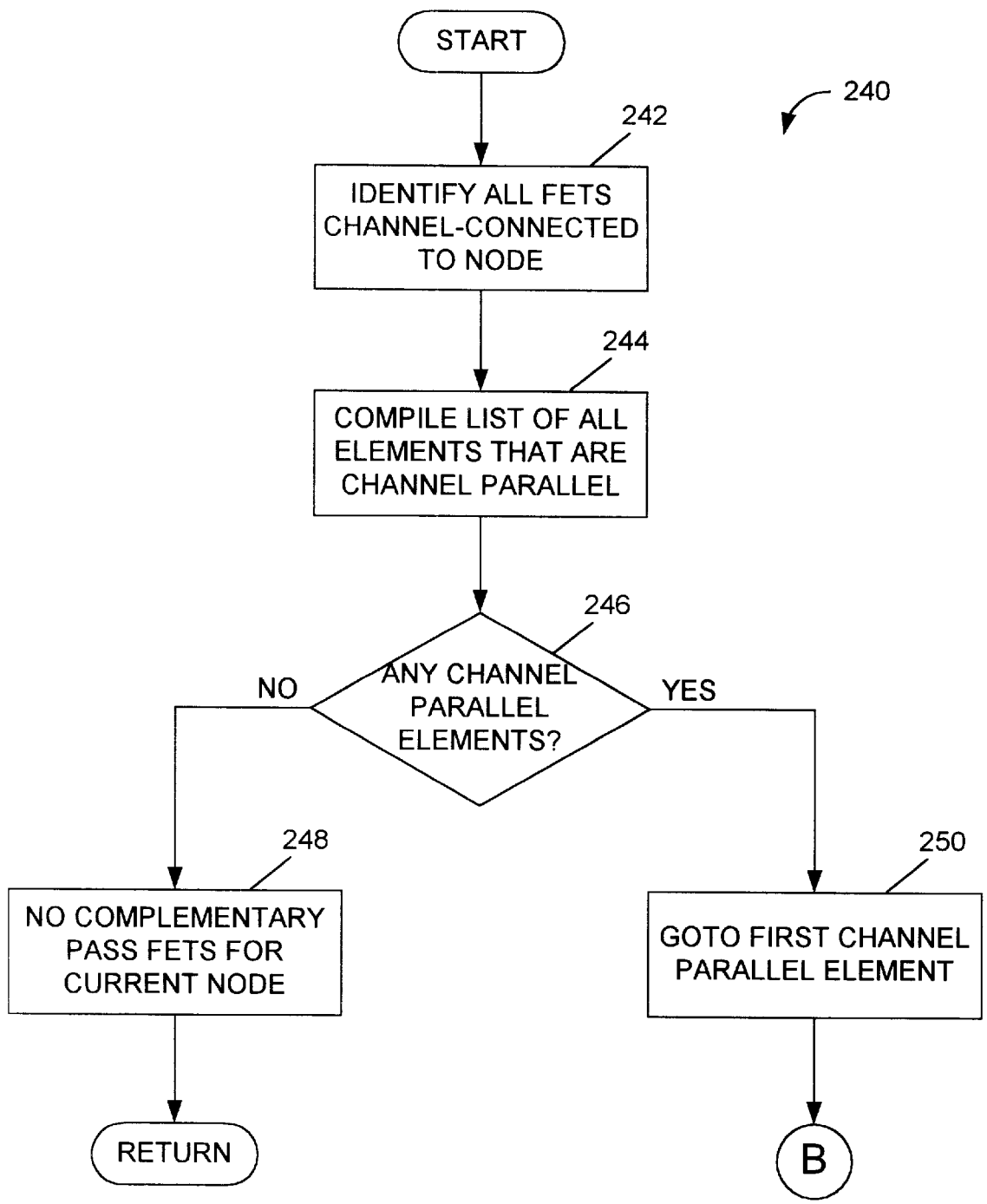
FIGS. 8A–8B collectively are a flow chart illustrating the top-level functional operation of the preferred method for identifying complimentary pass FET circuit configurations.
Figure 8B:
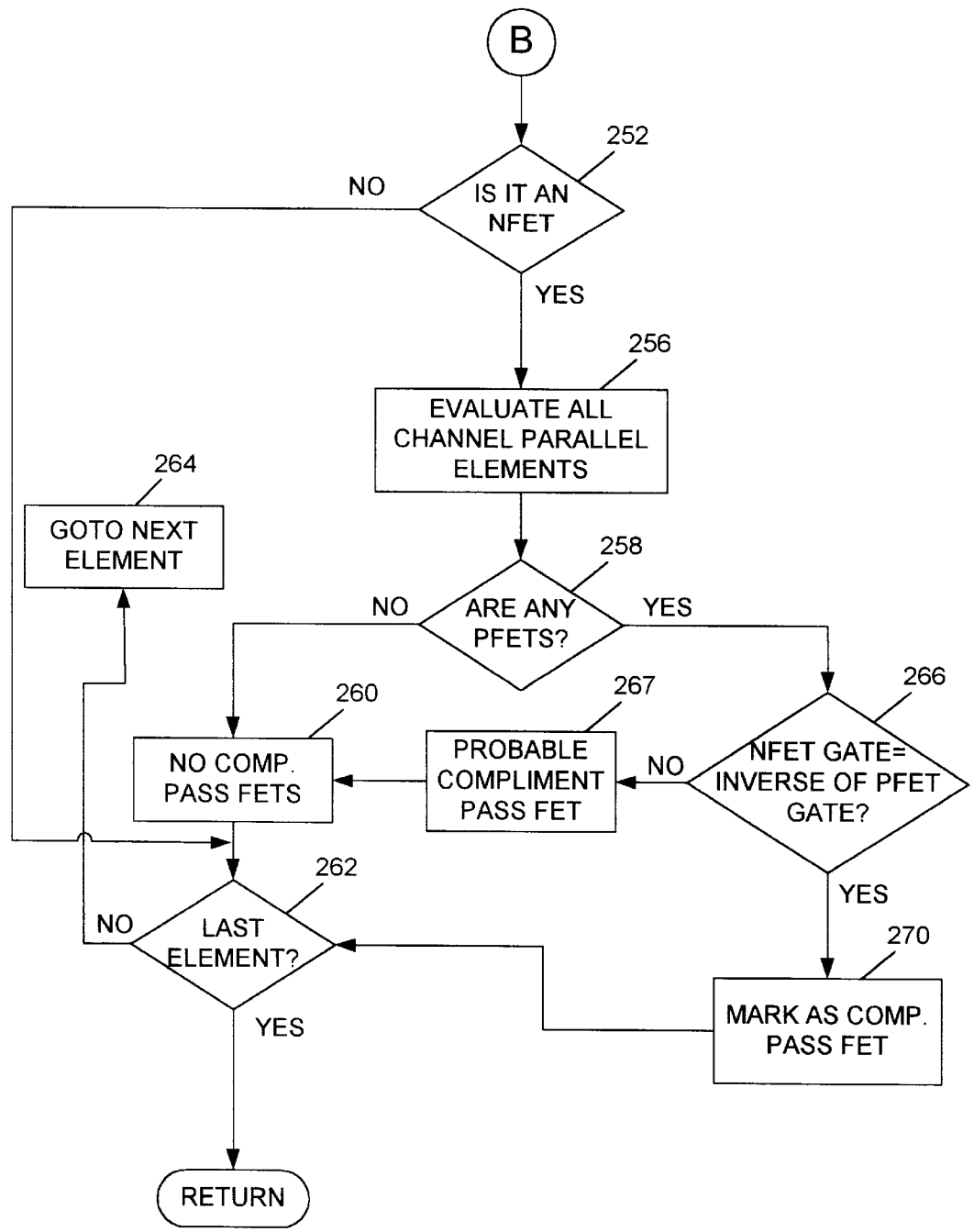

Having described the principal steps of the method of the top-level method for identifying single pass FET devices, reference is now made to FIGS. 8A and 8B, which collectively comprise a flow chart 240 that illustrates the principal steps involved in identifying complimentary pass FETs, as broadly denoted in step 204 of FIG. 7A. For any given node of a netlist (e.g., the current node), the method of the preferred embodiment identifies all FET elements that are channel connected to the node (step 242). From these elements, the method then compiles a temporary list of all elements that are channel connected to the node in channel-parallel fashion (step 244). The method then evaluates whether any such elements were identified as being channel-parallel (step 246). If not, then there are no complimentary pass FETs for the current netlist node (step 248), and the method may return to continue with method step 206 of FIG. 7A.

If, however, there are channel-parallel FET devices compiled at step 244, then the method proceeds to evaluate each of these elements one by one, starting at a first element on the list (step 250). Looking at the current elements, the method determines whether the element is an NFET (step 252). If not, the method determines whether that was the last element (step 262), then proceeds to the next element (step 264) and makes the same inquiry. If the current element is an NFET device, then the method evaluates all elements that are channel-parallel to this NFET (step 256). In this regard, the method determines whether any of the channel-parallel elements are PFET devices (step 258). If not, the method determines that the current element is not a part of a complimentary pass FET (step 260). The method then evaluates whether the previously evaluated element was the last element in the compiled list of channel-parallel elements (step 262). If not, the method proceeds to the next element (step 264) and returns to the inquiry of step 252. If, however, step 262 determines that the previously evaluated element was, in fact, the last element on the list of channel-parallel elements, then the routine of FIGS. 8A and 8B is completed, and the method may proceeds to step 206 of FIG. 7A.

If step 258, however, resolves to YES (i.e., there are PFET devices that are connected channel-parallel with the currently-evaluated NFET device), then the configuration is likely a complimentary pass FET configuration. At this point the method evaluates whether the gate of the NFET device is the inverse of the gate of the PFET device (step 266). In this respect, and as described in connection with FIG. 4, in order to form a complimentary pass FET configuration, the gate node of the NFET device of the complimentary pass FET must be the static inverse of the gate node of the PFET device. In accordance with the preferred embodiment of the present invention, this determination is made by evaluating certain flags associated with the netlist that are set at an earlier time. Alternatively, and consistent with the present invention, this determination is one which could be made "on the fly." Indeed, the making of this determination could be implemented in a variety of ways and therefore need not be further discussed herein.

Accordingly, if step 266 resolves to YES, then the method may mark the current PFET/NFET pair (by setting the appropriate flag of each element data structure) as comprising a complimentary pass FET (step 270), proceed to step 262, and continue from there as previously described. If, however, step 266 resolves to NO, then the method of the preferred embodiment simply marks the current PFET/NFET pair as comprising a "probable" complimentary pass FET configuration (step 267) and continues as previously described.

Figure 9:
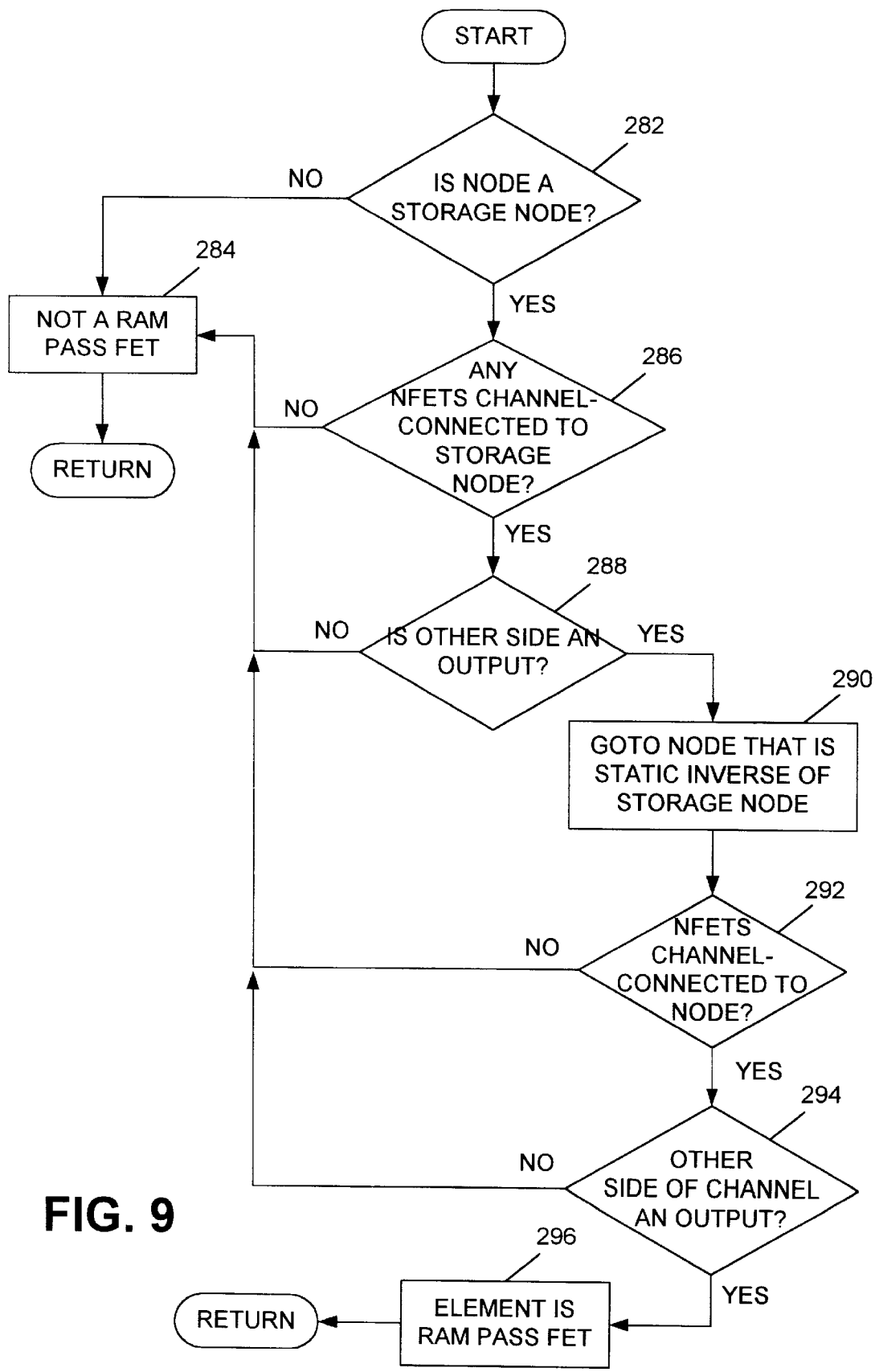
FIG. 9 is a flow chart depicting the top-level functional operation of the preferred method for identifying RAM pass FETs.

Reference is now made to FIG. 9, which is a flow chart 280 illustrating the top-level functional operation of the method employed by the preferred embodiment for detecting RAM pass FETs. Specifically, the flow chart 280 of FIG. 9 illustrates in more detail step 214 of FIG. 7A. In this regard, the method of the preferred embodiment evaluates a given node to determine whether the node is a storage node (step 282). This information may be retrieved from the PathMill output, or may be independently determined, consistent with the broader concepts of the present invention. It will be appreciated, that storage nodes are generally either nodes of a RAM cell, or latch nodes. If the inquiry of step 282 resolves to NO, then the method determines that the current node is not a node of a RAM pass FET (step 284), and the method may return to proceed with the processing at step 216 of FIG. 7A. If, however, the method determines that the current node is a storage node, then it proceeds to step 286, where it determines whether any NFET devices are channel connected to the current, storage node. If not, the method again determines that the current node is not a node of a RAM pass FET (step 284). In this regard, it should be understood by those skilled in the art that pass FETs associated with RAM cells are comprised of NFET devices. If, however, step 286 identifies NFET devices that are channel connected to the current storage node, then the method proceeds to step 288 where the method makes the determination as to whether the channel node opposite the current node is an output. More specifically, if a single NFET device is connected to the current, storage node by its source node, then step 288 evaluates the drain node of that NFET device to determine whether the drain node is an output. Consistent with the preferred method, the determination of step 288 may be made in various ways, including evaluating the direction flag that is associated with the current NFET device; namely whether the direction flag is set as defining the NFET as conducting from source to drain or from drain to source, whether it is bi-directional, or whether it is unset. Furthermore, it will be appreciated that the processing beginning at step 288 will be repeated for each NFET device identified at step 286 as being channel connected to the storage node.

If the opposite side of the channel connected NFET device is not an output, then the current NFET device is not a RAM pass FET, and the method may return to step 284. If, however, the opposite channel node of the current NFET device is determined to be an output, then the method evaluates the netlist node that is the static inverse of the current, storage node (step 290). To better illustrate this step, reference is again made briefly to FIG. 5. Assuming the current storage node is node 134, and the current NFET device identified as being channel connected to the storage node is NFET 132, and further that the opposite node 134 is determined to be an output (e.g., the node connected to bit line 140), then the method at step 290 will proceed to evaluate the node of the inverse of bit line 140; namely bit line 138. As previously described, the bit line 138 and bit line 140 will be the inverse of one another for a RAM cell. In this regard, an inverter element (not shown) will interconnect these two lines. The method of the preferred embodiment of the present invention may identify such inverters in a preprocessing step, so that at step 290, for a given node, the method may simply evaluate the node opposite the inverter. Alternatively, for a given node, step 290 may be implemented to identify any inverter devices that are connected to the current node, and then proceed to the opposite side of any such inverters. Once the method has proceeded to the static inverse node (step 290) it proceeds to evaluate that node to determine whether there are any NFETs that are channel connected to that node (step 292). If not, then the NFET device currently under evaluation is deemed not to be a RAM pass FET and the method may proceed to step 284. If, however, step 292 in fact identifies NFET devices that are channel connected to the node, then the method evaluates the channel node opposite the storage node to determine whether that opposite node is an output (step 294). It will be appreciated that step 294 may be implemented in the same manner as step 288. If step 294 determines that the other side of the channel connected NFET is not an output, then the method may proceed to step 284. If, however, the method determines the other side to, in fact, be an output, then the NFET device under evaluation is deemed to be a RAM pass FET (step 296) and the method may return to continue with the processing at step 216 of FIG. 7A.

To better illustrate the operation of the flow chart depicted in FIG. 9, again consider the schematic diagram of the CMOS RAM cell illustrated in FIG. 5. Assuming that the current node is node 136, then step 286 will identify FETs 126 and 130 as being NFET devices that are channel connected to the storage node. Proceeding to step 288, NFET 126 will fail the test, as the opposite side of NFET 126 is connected to ground and is therefore not an output. However, NFET 130 will pass the test of 288 as the other side (which is connected to bit line 138) will be determined to be an output. As previously mentioned, at step 290 the method will then evaluate node 134, which is the static inverse of node 136. Step 292 will identify NFET 132 as being channel connected to node 134. Finally, step 294 will identify the opposite node (i.e., node 138) as being an output node. Thus, the method will identify NFET 130 as being a RAM pass FET. It will be appreciated that the same determination will be made of NFET 132, when evaluating node 134.

Reference is now made to a method for detecting single pass FETs in accordance with the present invention. In short, the method of the present invention proceeds through the netlist, evaluating each node. It first looks for a node that is, for example, a gate output. If the currently-evaluate node is not such an output, then the method proceeds to the next node. Once the method identifies a current node to be a gate output, it then determines whether any FETs are channel-connected to the current node. If so, it evaluates all such FETs to determine whether the input node of the FET(s) is the same as the current node. If so, then the method sets the "current node" to the input node of any such FET, and performs the above-described steps recursively. When a point is reached such that a given test fails (essentially indicating that a static gate input or a supply—VDD or ground—has been reached), then the routine is completed, and all series-connected FETs identified above may be marked as pass FETs.

Figure 10:
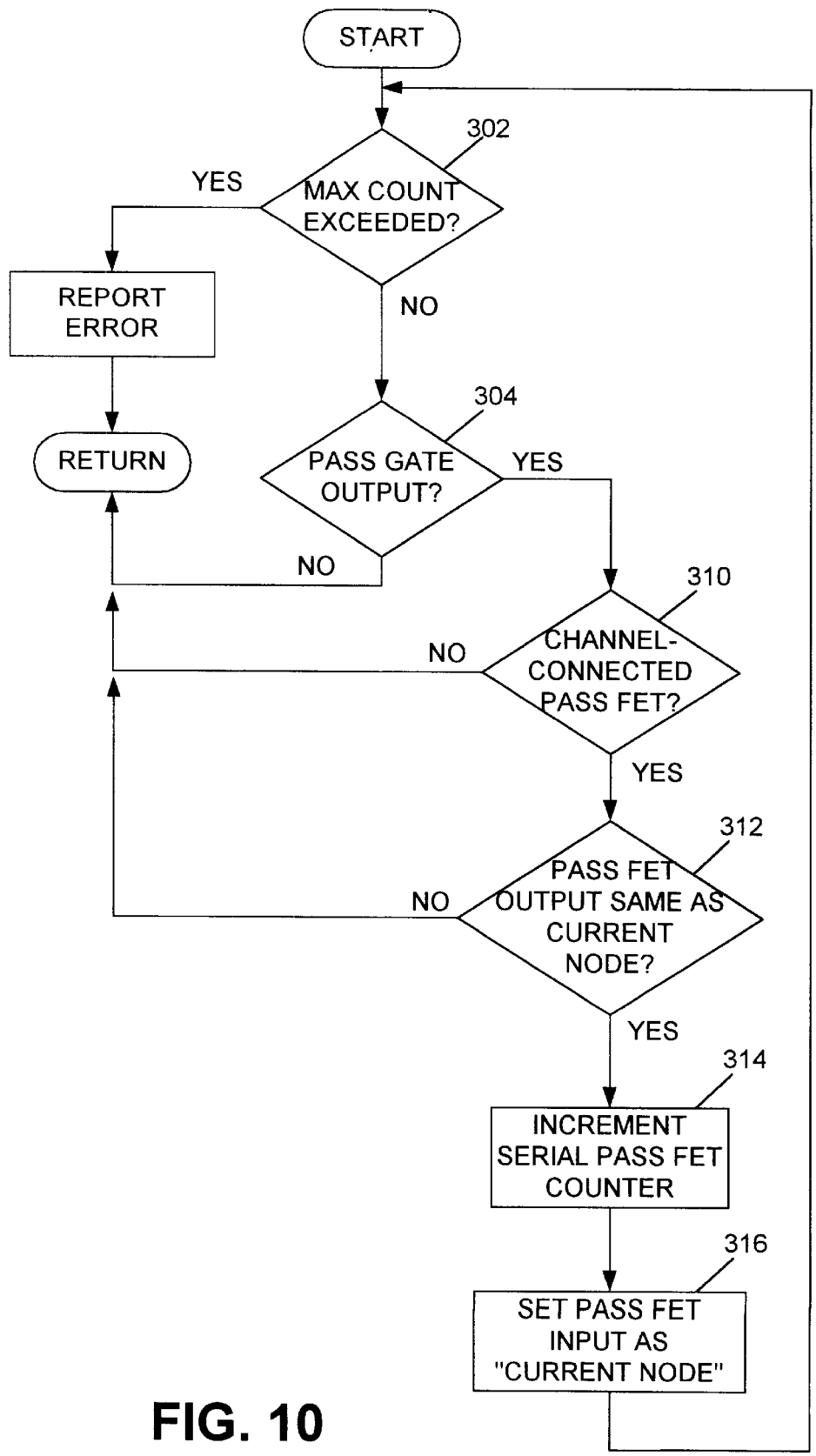
FIG. 10 is a flow chart depicting the top-level functional operation of the preferred method for identifying multiple, series-connected pass FETs.

To more particularly describe the method of the present invention, reference is made to FIG. 10, which is a flow chart 300 that illustrates the top-level functional operation of a method for identifying an excessive number of series-connected pass FETs. The methods described above for identifying complimentary pass FET devices, RAM pass FET devices, and single pass FET devices execute first, and set the appropriate flags in the data structure for each element in the netlist. Then, the method of the present invention may again proceed to a first node in the netlist, and initialize a count (a count of serial pass FET devices) to zero. The method may then determine whether a maximum serial pass FET count has been exceeded (step 302).

Assuming that the maximum count has not been exceeded, the method then evaluates the current node to determine whether it is a pass gate output (step 304). If the current node is not a pass gate output node, then the method may simply end, or issue a return from the routine. The method of the preferred embodiment is implemented in a recursively-called software routine. Further, and although not shown, the preferred embodiment may (before entering the recursive routine) first check the current node to determine whether it is a static gate input. If not, the system may bypass the routine in order to avoid starting in the middle of a series of pass FET devices, and instead start at an endpoint.

In keeping with the description of FIG. 10, if the current node has been identified as a pass gate output, then the method proceeds to determine whether there are any pass FETs that are channel-connected to the current node (step 310). This evaluation may be made by evaluating the various pass FET flags within the data structure of the current element. Specifically, the method may individually evaluate each element that is connected to the current node, and separately evaluate whether such elements are channel-connected to the node and whether such elements are pass FET devices. Information regarding the elements which are connected with a given node may be readily obtained from the netlist.

For every pass FET device that is channel connected to the current node, the method evaluates each such pass FET device to determine whether the output node of the pass FET device(s) is the same as the current node (step 312). If so, then the method recognizes the pass FET device as a series-connected pass FET, and it increments a serial pass FET counter (step 314) and sets the new "current node" to be the input node of that pass FET. The method may then loop back to step 302 where it repeats the evaluations of steps 302, 304, and 312 as described above. As long as these evaluations resolve as discussed above, then the method continues to identify additional series-connected pass FETs, and continues to increment the serial pass FET count.

In accordance with the invention, each time the serial pass FET counter is incremented (step 314), the method loops back to step 302. There, if the count exceeds a predetermined maximum count number, then the system of the invention reports an appropriate error message.

It will be appreciated that updating the "current node" in accordance with step 316 (along with the recursive execution of the routine) allows the method of the invention to traverse a string of series-connected pass FETs. It will further be appreciated that the evaluation of step 312 may be performed by evaluating direction flags associated with the channel nodes of an element (within the data structure of the element), or by evaluating other information provided with the netlist. In the system of the preferred embodiment, direction flags may be "unset", or set as "bidirectional", "source-to-drain", or "drain-to-source" (See FIG. 3). Step 312 in the method of the preferred embodiment resolves to "No" if the direction flags are "unset" or "bidirectional."

In the preferred embodiment, the method of the present invention is called recursively. Outside of the routine illustrated in FIG. 10, additional steps are provided to ensure that every node in the netlist is traversed. As nodes of the netlist may be evaluated, as by traversing a string of pass FETs (step 316), they may be optionally marked so that they need not be reevaluated again. Of course, other methods of ensuring proper traversal of the netlist may also be provided.

Figure 11:
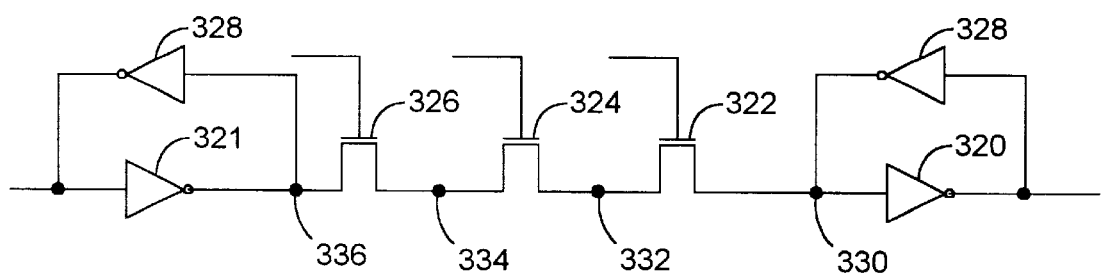
FIG. 11 is a schematic diagram illustrating a portion of a circuit having a plurality of series-connected pass FETs.

By way of illustration, reference is now made briefly to FIG. 11, which is a schematic diagram of a circuit having a plurality of series-connected pass FETs. More particularly, FIG. 11 illustrates a series connection of three pass FET devices 322, 324, and 326, series connected between two inverter elements 320 and 321. Four intervening nodes 330, 332, 334, and 336 are also illustrated. For purposes of illustrating the method of the present invention, it is assumed that the circuit of FIG. 11 comprises a small portion of a much larger integrated circuit.

In accordance with the method of the present invention, the method traverses nodes within a netlist to identify a pass gate output. Assuming, for example, that the node in question is node 330, then the method of the present invention (at step 304) will recognize this node as being a pass gate output (the node of a latch comprising inverters 320 and 328). The method then proceeds to step 310 to identify any channel connected pass FETs. Although additional pass FETs (not shown) may be connected to node 330, the invention will identify at least pass FET 322. More specifically, the method will first identify pass FET 322 as being a FET device that is channel connected to node 330. It may then evaluate the data structure for the FET element 322, and in doing so, will identify it to be a pass FET. The method (at step 312) will then further evaluate the data structure of pass FET 322 to identify its direction. Assuming that the direction of the FET 322 is set from source to drain and further that the source node is connected at node 322, while the drain node is connected at node 330, then the evaluation at step 312 will resolve to YES. Accordingly, the method will proceed to step 314 where it increments a serial pass FET counter, and then on to step 316 where it sets the current node from node 330 to node 332. Alternatively, but consistent with the scope and spirit of the present invention, the method may make the determination as to whether a node is an output node or an input node in an other manners.

As illustrated in FIG. 10, the method then returns to step 310 where it makes the same evaluation as before. In this evaluation, the method will identify both FETs 324 and 322 as being channel connected to node 332. However, with the subsequent evaluation performed in step 312, the method will identify only FET 324 as having an output node that is the same as the "current node" (node 332). Again, the method will increment the serial pass FET counter (step 314) and set the current node to the input node (i.e., node 334) of pass FET 324. The foregoing steps will then be repeated in yet a further iteration, until the method reaches node 336. At this node, step 312 will fail, as the only pass FET that is channel-connected to node 336 is pass FET 326, but its output node (i.e., node 334) is not the same as the current node (node 336).

Although not specifically illustrated, it will be appreciated that the method of the preferred embodiment may, after completion of the method steps, evaluate the serial pass FET counter to identify a count of three, representing pass FETs 322, 324 and 326. Alternatively, the method may operate by traversing netlist nodes until identifying a pass gate input node, and thereafter loop on the channel nodes opposite that input node to detect an output node. Then, the method may set that output node as the current node and repeat the foregoing steps. In this way, the method would first identify node 336 and traverse the string of pass FETs in the opposite direction, until reaching node 330.

It should be appreciated that the steps illustrated in the flow charts of FIGS. 7A, 7B, 8A, 8B, 9, and 10 are provided for purposes of illustration and are not deemed to be limiting on the broader aspects of the present invention. Indeed, the broader aspects of the present invention may be implemented using a variety of different approaches that are still consistent with the scope and content of the present invention. As illustrated in FIG. 2, a portion 102 of the electrical rules checker program 100 of the present invention is configured to detect multiple, series-connected pass FET devices. In accordance with this broader aspect, a system may be provided for detecting such pass FETs. In the preferred embodiment, the system comprises software which may be provided on a computer readable storage medium in a form of code segments that are particularly configured to perform various functions.

Figure 12:
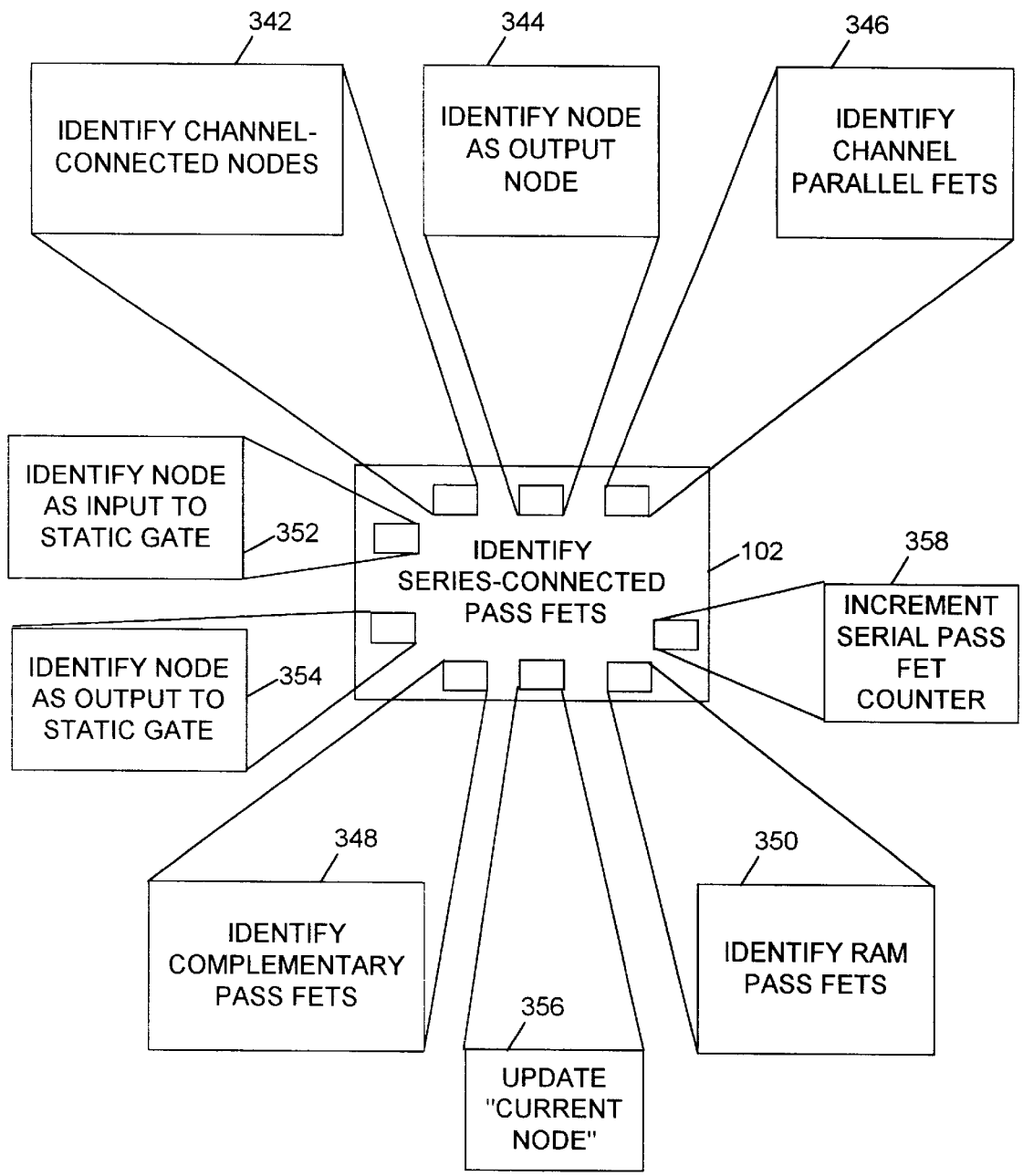
FIG. 12 is a block diagram illustrating certain fundamental code segments comprising a system constructed in accordance with the invention.

In this regard, reference is now made to FIG. 12 which illustrates certain functions which may be carried out by a system constructed in accordance with the teachings of the invention. For example, the code segment 102 may comprise a plurality of code segments including a segment for identifying channel-connected nodes 342. Another segment 344 is provided for identifying a given node as an output node. Yet another segment 346 may be configured to identify channel-parallel FET devices. Still another node 348 may be configured to identify complimentary pass FETs. Still another segment 350 may be configured to identify RAM pass FETs. Segments 352 and 354 may also be provided for identifying the current node as the input node of a static gate or the output node of a static gate, respectively. Another segment 356 may be provided to update the "current node" pointer, while yet another segment may be provided for incrementing the serial pass FET counter 358. Yet additional segments (not illustrated) may be provided in connection with the system of the present invention. As will be appreciated by persons of skill in the art in light of the teachings provided herein.

In should be appreciated that the flow charts of FIGS. 7–11 show the top-level operation of only one possible implementation of the methods of the present invention. In this regard, each block represents a module, segment, or portion of code, which comprises one or more executable instructions for implementing the specified logical function(s). It should also be noted that in some alternative implementations, the functions noted in the blocks may occur out of the order noted in FIGS. 7–11. For example, two blocks shown in succession may in fact be executed substantially concurrently or the blocks may sometimes be executed in the reverse order, depending upon the functionality involved.

The foregoing description is not intended to be exhaustive or to limit the invention to the precise forms disclosed. Obvious modifications or variations are possible in light of the above teachings. In this regard, the embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A method for identifying multiple, series-connected pass FETs in an integrated circuit, by evaluating a netlist comprising the steps of:
   (a) evaluating a current node in the netlist to determine whether the current node is a pass gate output;
   (b) identifying at least one pass FET that is channel-connected to the current node;
   (c) determining that an input node of the at least one pass FET is the same node as the current node;
   (d) reassigning the current node to be an input node of the at least one pass FET; and
   (e) repeating steps (b) through (d).

2. The method as defined in claim 1, further including the step of incrementing a serial pass FET counter commensurate with step (d).

3. The method as defined in claim 1, wherein the method is implemented in a software routine that is called recursively.

4. The method as defined in claim 1, wherein the step of identifying at least one pass FET includes the step of evaluating a data structure for each element connected to the current node.

5. The method as defined in claim 4, wherein the step of evaluating the data structure includes examining flags within the data structure.

6. The method as defined in claim 5, wherein the step of examining flags includes examining at least one from the group consisting of: a single pass FET flag, a complementary pass FET flag, and a RAM pass FET flag.

7. The method as defined in claim 5, wherein the step of evaluating the direction flag within a data structure of the at least one pass FET further includes determining whether the direction flag is set in one manner from the group consisting of: "unset", "bidirectional", "source-to-drain", and "drain-to-source".

8. A method for identifying multiple, series-connected pass FETs in an integrated circuit, by evaluating a netlist comprising the steps of
   (a) evaluating a current node in the netlist to determine whether the current node is a pass gate input;
   (b) identifying at least one pass FET that is channel-connected to the current node;
   (c) determining that an output node of the at least one pass FET is the same node as the current node;
   (d) reassigning the current node to be an output node of the at least one pass FET; and
   (e) repeating steps (b) through (d).

9. The method as defined in claim 8, further including the step of incrementing a serial pass FET counter commensurate with step (d).

10. The method as defined in claim 8, wherein the method is implemented in a software routine that is called recursively.

11. The method as defined in claim 8, wherein the step of identifying at least one pass FET includes the step of evaluating a data structure for each element connected to the current node.

12. The method as defined in claim 11, wherein the step of evaluating the data structure includes examining flags within the data structure.

13. The method as defined in claim 12, wherein the step of examining flags includes examining at least one from the group consisting of: a single pass FET flag, a complementary pass FET flag, and a RAM pass FET flag.

14. The method as defined in claim 8, wherein the step of determining that an output node of the at least one pass FET further includes the step of evaluating a direction flag within a data structure of the at least one pass FET.

15. A system for identifying multiple, series-connected pass FETs in an integrated circuit by evaluating a netlist comprising:
   means for identifying a current node that is at an endpoint of a series of pass FET devices;
   means for identifying at least one pass FET that is series connected to the current node;
   means for evaluating direction of the at least one pass FET device;
   means for resetting a new "current node" to a channel node of the at least one pass FET that is opposite the previous "current node".

16. The system as defined in claim 15, further including means for maintaining a count of the number of series connected pass FETs.

17. The system as defined in claim 15, wherein the means for identifying the endpoint of a series of pass FET devices includes means for detecting a pass gate output.

18. The system as defined in claim 15, wherein the means for identifying the endpoint of a series of pass FET devices includes means for detecting a pass gate input.

19. The system as defined in claim 15, wherein the means for identifying at least one pass FET includes a data structure associated with the pass FET, the data structure having at least one flag for identifying the pass FET as being at least one from the group consisting of: a single pass FET, a RAM pass FET, and a complimentary pass FET.

20. The system as defined in claim 15, wherein the means for evaluating the direction of the at least one pass FET includes a data structure associated with the pass FET, the data structure having at least one flag that indicates the conducting direction of the at least one pass FET.

* * * * *